United States Patent
Nam et al.

(10) Patent No.: US 8,513,884 B2
(45) Date of Patent: Aug. 20, 2013

(54) FLAT PANEL DISPLAY APPARATUS AND ORGANIC LIGHT-EMITTING DISPLAY APPARATUS

(75) Inventors: Kie-Hyun Nam, Yongin (KR); Hoon Kim, Yongin (KR); Dong-Ki Lee, Yongin (KR); Jin-Wook Seong, Yongin (KR); Hong Chen, Yongin (KR); Jung-Mi Choi, Yongin (KR); Ji-Sil Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 198 days.

(21) Appl. No.: 12/976,937

(22) Filed: Dec. 22, 2010

(65) Prior Publication Data

US 2011/0187629 A1 Aug. 4, 2011

(30) Foreign Application Priority Data

Feb. 2, 2010 (KR) .................... 10-2010-0009558

(51) Int. Cl.
*H05B 33/04* (2006.01)
(52) U.S. Cl.
USPC .............................. 313/512; 445/25; 313/504
(58) Field of Classification Search
USPC .............................. 313/504, 506, 512; 445/25
See application file for complete search history.

(56) References Cited

U.S. PATENT DOCUMENTS

| | | | |
|---|---|---|---|
| 6,368,730 B1 * | 4/2002 | Kishimoto et al. | 428/690 |
| 6,590,337 B1 * | 7/2003 | Nishikawa et al. | 313/509 |
| 7,095,169 B2 | 8/2006 | Ohishi et al. | |
| 2003/0189403 A1 * | 10/2003 | Yamada et al. | 313/511 |
| 2004/0135500 A1 | 7/2004 | Omura | |
| 2005/0023976 A1 | 2/2005 | Wang | |
| 2005/0248270 A1 * | 11/2005 | Ghosh et al. | 313/512 |
| 2008/0136320 A1 * | 6/2008 | Choi | 313/504 |
| 2008/0238302 A1 * | 10/2008 | Sung et al. | 313/504 |

FOREIGN PATENT DOCUMENTS

| | | |
|---|---|---|
| JP | 2005019300 | 1/2005 |
| JP | 2005285573 | 10/2005 |
| KR | 20020065125 A | 8/2002 |
| KR | 20030042169 A | 5/2003 |
| KR | 10-2004-0010236 A | 1/2004 |
| KR | 20050048133 A | 5/2005 |
| KR | 1020060024459 A | 3/2006 |
| KR | 1020060106089 A | 10/2006 |
| KR | 100649221 B1 | 11/2006 |

OTHER PUBLICATIONS

Korean Office action issued by KIPO on Nov. 30, 2011, corresponding to KR 10-2010-0009558 and Request for Entry attached herewith.

Korean Office Action issued by Korean Patent Office on Apr. 22, 2011, corresponding to Korean patent Application No. 10-2010-0009558 and Request for Entry of the Accompanying Office Action attached herewith.

\* cited by examiner

*Primary Examiner* — Mary Ellen Bowman
(74) *Attorney, Agent, or Firm* — Robert E. Bushnell, Esq.

(57) ABSTRACT

A flat panel display apparatus includes a substrate; a display unit which is formed on the substrate and displays an image; a metal sheet which faces towards the substrate; a sealant which fills the entire free space between the substrate and the metal sheet and seals the space between the substrate and the metal sheet; and a polymer layer which is disposed on a surface of the metal sheet and has a lower thermal expansion coefficient than the metal sheet. An organic light-emitting display (OLED) apparatus including a sealant which fills an entire space between a substrate and a metal sheet is also disclosed.

20 Claims, 2 Drawing Sheets

FLAT PANEL DISPLAY APPARATUS AND ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 2 Feb. 2010 and there duly assigned Serial No. 10-2010-0009558.

BACKGROUND OF THE INVENTION

1. Field of the Invention

The embodiments of the present invention relate to a flat panel display apparatus and an organic light-emitting display (OLED) apparatus, and more particularly, to a thin flat panel display apparatus and an OLED apparatus which are manufactured with lower cost for material manufacturing the thin flat panel display apparatus and the OLED apparatus by using simpler manufacture processes.

2. Description of the Related Art

An organic light-emitting display (OLED) apparatus generally includes a pixel electrode, a counter electrode, and an emission layer (EML) formed between the pixel electrode and the counter electrode. When a voltage difference is applied between the pixel electrode and the counter electrode, holes injected from the pixel electrode are combined with electrons injected from the counter electrode in the EML. Then, when the combinations of holes-electrons disappear in the EML, excitation of such combinations is released, the EML emits light, and the OLED apparatus may display images.

SUMMARY OF THE INVENTION

It is therefore one aspect for the present invention to provide a thin flat panel display apparatus and an organic light-emitting display (OLED) apparatus which are manufactured at low material costs using simple processes.

In accordance with an aspect of the present invention, a flat panel display apparatus may include a substrate; a display unit which is formed on the substrate and realizes and displays an image; a metal sheet which faces towards the substrate; a sealant which fills an entire space between the substrate and the metal sheet and seals the space between the substrate and the metal sheet; and a polymer layer which is disposed on a first surface of the metal sheet and has a lower thermal expansion coefficient compared to that of the metal sheet.

The polymer layer may be disposed on the first surface of the metal sheet which is opposite to a second surface of the metal sheet facing towards the display unit.

The polymer layer may be laminated directly on the first surface of the metal sheet.

The polymer layer may physically contact the entire first surface of the metal sheet.

The flat panel display apparatus may further include an absorbent formed between the substrate and the metal sheet.

The absorbent may be disposed on the second surface of the metal sheet which faces the display unit.

The absorbent may be coated directly on the second surface of the metal sheet which faces towards the display unit.

The absorbent may include one or more materials selected from calcium oxide (CaO), barium oxide (BaO), a zeolite-based organic metal complex, an aluminum (Al)-based organic metal complex, and a polyacrylic acid.

The metal sheet may include one or more materials selected from Al, stainless steel (SUS), invar, and magnesium (Mg).

The polymer layer may include polyethylene terephthalate (PET) or polyethylene nylon (PEN).

The sealant may include one or more materials selected from an epoxy-based adhesive, a silicon-based adhesive, and an acryl-based adhesive.

The display unit may be an organic light-emitting device which includes an organic emission layer (OEML) which intervenes between first and second electrodes.

In accordance with another aspect of the present invention, an organic light-emitting display (OLED) apparatus may include a substrate; an organic light-emitting device disposed above substrate and including an organic emission layer (OEML) which intervenes between first and second electrodes; a metal sheet disposed spaced apart and opposite to the substrate; a sealant filling the entire space between the substrate and the metal sheet and sealing the entire space between substrate and the metal sheet; a polymer layer in direct physical contact with a first surface of the metal sheet which is opposite to a second surface of the metal sheet facing towards the organic light-emitting device and having a lower thermal expansion coefficient compared to that of the metal sheet; and an absorbent which is disposed between the substrate and the metal sheet.

The polymer layer may contact the entire first surface of the metal sheet.

The polymer layer may include polyethylene terephthalate (PET) or polyethylene nylon (PEN).

The sealant may include one or more materials selected from an epoxy-based adhesive, a silicon-based adhesive, and an acryl-based adhesive.

The absorbent may be coated directly on the second surface of the metal sheet which faces toward the organic light-emitting device.

The OLED apparatus may further include a buffer layer which is formed on the substrate.

An image may be realized by light transmitted toward the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

In a flat panel display apparatus including an organic light-emitting device, a display unit including the organic light-emitting device may be sealed by using a glass sealing substrate.

Since the glass sealing substrate has constant thickness in order to bear external stress in a process of manufacturing the flat panel display apparatus, manufacturing a thin flat panel display apparatus may become difficult.

An OLED apparatus may be thermalized by penetration of external oxygen and moisture. In order to solve this problem, the OLED apparatus may be sealed with an inorganic sealant, for example, a frit. Hardening such frit however requires a high temperature bonding process, therefore, the OLED apparatus may be damaged under such high temperature and a large amount of time may be required to irradiate a laser onto the frit for hardening the frit. The OLED apparatus sealed by such frit is therefore disadvantageous when being used for a large area substrate, and a mechanism strength of the OLED apparatus may be disadvantageously lowered.

Exemplary embodiments of the present invention will now be described in detail with reference to the attached drawings.

Figure 1:
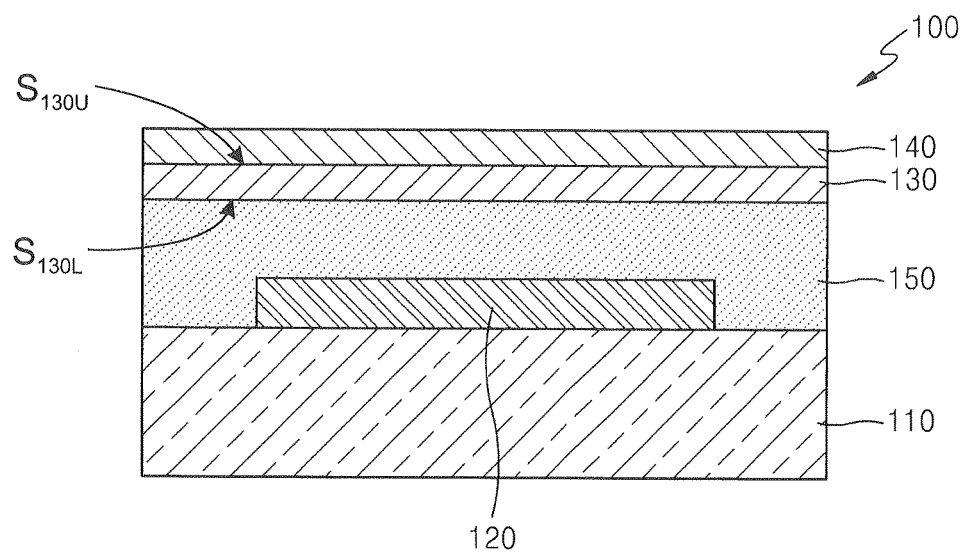
FIG. 1 is a schematic cross-sectional view of a flat panel display apparatus constructed with principles of an embodiment of the present invention.

FIG. 1 is a schematic cross-sectional view of a flat panel display apparatus constructed with principles of an embodiment of the present invention.

Referring to FIG. 1, a flat panel display apparatus 100 constructed with the present embodiment may include a substrate 110, a display unit 120, a metal sheet 130, a sealant 150, and a polymer layer 140.

The substrate 110 may be a transparent glass substrate which includes $SiO_2$ as a main component, however is not limited thereto.

The display unit 120 may be formed on the substrate 110 to realize and display an image. In one embodiment, the display unit 120 may be in direct contact with the substrate 110.

The display unit 120 may include various types of devices which may realize and display an image. For example, the display unit 120 may include an organic light-emitting device, an inorganic light-emitting device, a liquid crystal device (LCD), an electrophoretic device, and the like.

The metal sheet 130 may be disposed as a sealing member for sealing the display unit 120 disposed on the substrate 110.

The metal sheet 130 may include one or more metal materials selected from aluminum (Al), stainless steel (SUS), invar, and magnesium (Mg).

Since the metal sheet 130 may be manufactured to have a thickness of about several micrometers (μm), the flat panel display apparatus 100 may become advantageously thinner compared to the flat display apparatus in which a glass substrate is used as the sealing member.

Since the metal sheet 130 is cheaper than the glass substrate, material cost may be advantageously reduced.

The sealant 150 may be disposed between the substrate 110 and the metal sheet 130. In one embodiment, the sealant 150 may be in direct physical contact with both of the substrate 110 and the metal sheet 130, and the sealant 150 may be in direct physical contact with the display unit 120.

The sealant 150 may include one or more materials selected from an epoxy-based adhesive, a silicon-based adhesive, and an acryl-based adhesive.

If a frit is used as a sealant, a high temperature laser bonding process is required to harden the fit. Thus, a flat panel display apparatus may be damaged, and a large amount of time may be required to irradiate a laser onto the frit. Thus, the fit may be disadvantageous to a large area substrate, and mechanism strength of the flat panel display apparatus may be disadvantageously lowered.

In accordance with the present embodiment, however, since the substrate 110 is physically bonded to the sealant 150 at a lower temperature compared to being physically bonded to the frit, the flat panel display apparatus 100 is not deteriorated.

Also, since the sealant 150 may be coated directly on the metal sheet 130 to bond the metal sheet 130 to the substrate 110, time of manufacturing the LCD display device may be shortened.

The sealant 150 according to the present embodiment may fill the entire space disposed between the substrate 110 and the metal sheet 130.

On the other hand, a sealant of a contemporary flat panel display apparatus is coated only on an edge of a space formed by a substrate and the sealing member (e.g., a glass substrate), and the sealant is disposed at a partial of spaced disposed between the substrate and the sealing member.

The sealant 150 of the flat panel display apparatus 100 according to the present embodiment may operate as a filler filling the entire space disposed between the substrate 110 and the metal sheet 130, and thus increasing a mechanism strength of the flat panel display apparatus 100.

The polymer layer 140 may be formed on a surface $S_{130U}$ of the metal sheet 130 opposite to a surface $S_{130L}$ of the metal sheet 130, and the surface $S_{130L}$ faces towards the display unit 120. In one embodiment, the polymer layer 140 may be exposed to the exterior of the display device.

The sealant 150 may be bonded to the substrate 110 and then be hardened by radiation of ultraviolet rays or the like. A temperature of the metal sheet 130, onto which energy is irradiated during the sealant 150 is being hardened, increases. Since the metal sheet 130 has a high thermal expansion coefficient, the metal sheet 130 may expand with an increase in the temperature thereof. The metal sheet 130 may shrink with a decrease in the temperature thereof. Therefore, a surface of the metal sheet 130 may become wrinkled due to the expansion and shrink of the metal sheet 130.

In accordance with the present embodiment, however, since the polymer layer 140 is formed on an outer surface $S_{130U}$ of the metal sheet 130, the polymer layer 140 may operate as a thermal buffer with respect to the metal sheet 130.

The polymer layer 140 may be formed directly on the surface $S_{130U}$ of the metal sheet 130 by using a laminating method, a printing method, or the like to cover the entire surface $S_{130U}$ of the metal sheet 130. A thermal expansion coefficient of the polymer layer 140 may be lower compared to the thermal expansion coefficient of the metal sheet 130. The polymer layer 140 may include polyethylene terephthalate (PET) or polyethylene nylon (PEN). The polymer layer 140 may include various types of materials having lower thermal expansion coefficients than the metal sheet 130.

The polymer layer 140 may prevent wrinkling of the surface the metal sheet 130 caused by the expansion and shrink of the metal sheet 130.

In accordance with the present embodiment, the flat panel display apparatus 100 may be manufactured to have a thinner thickness at lower material costs by using a simpler process.

Figure 2:
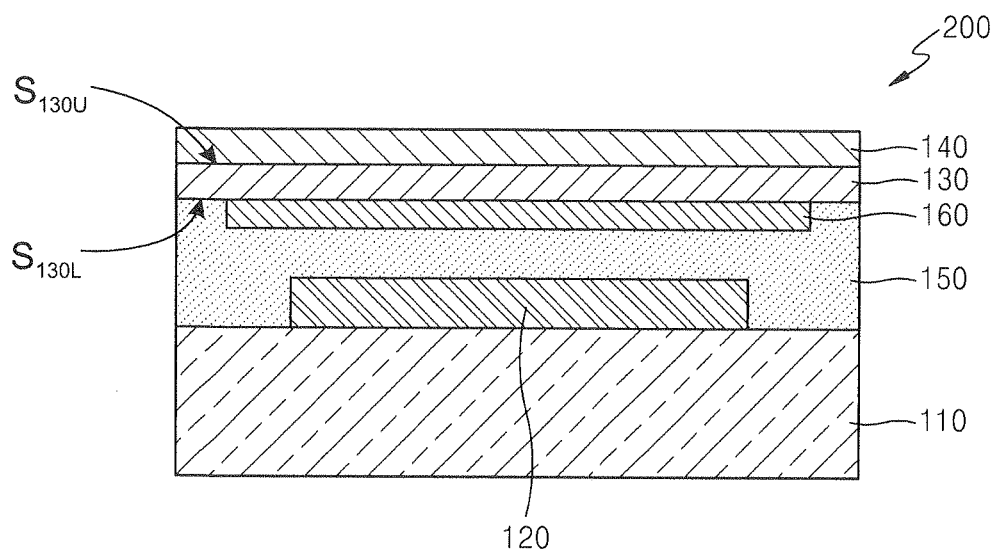
FIG. 2 is a schematic cross-sectional view of a flat panel display apparatus constructed with principles of another embodiment of the present invention.

FIG. 2 is a schematic cross-sectional view of a flat panel display apparatus constructed with principles of another embodiment of the present invention.

Referring to FIG. 2, a flat panel display apparatus 200 constructed with the present embodiment may include a substrate 110, a display unit 120, a metal sheet 130, a sealant 150, a polymer layer 140, and an absorbent 160.

Hereinafter, differences between the flat panel display apparatus 100 of the previous embodiment and the flat panel display apparatus 200 of the present embodiment will be mainly described. Like reference numerals denote like elements.

In comparison with the flat panel display apparatus 100 of the previous embodiment as shown in FIG. 1, the flat panel display apparatus 200 of the present embodiment may further include the absorbent 160 disposed between the substrate 110 and the metal sheet 130.

The absorbent 160 may be disposed directly on a surface $S_{130L}$ of the metal sheet 130 which faces towards the display unit 120. The sealant 160 may fill an entire space disposed between the substrate and the metal sheet and seal the entire space.

The absorbent 160 may be formed to have a smaller area than the entire area of surface $S_{130L}$ of the metal sheet 130. The absorbent 160 may be formed directly on the surface $S_{130L}$ of the metal sheet 130 by using a laminating method, a printing method, or the like.

The absorbent 160 may include one or more materials selected from calcium oxide (CaO), barium oxide (BaO), a zeolite-based organic metal complex, an aluminum (Al)-based organic metal complex, and a polyacrylic acid.

In accordance with the present embodiment, the flat panel display apparatus 200 may be manufactured to be thinner at lower material costs by using a simpler process and may be prevented from deterioration due to moisture permeance.

Figure 3:
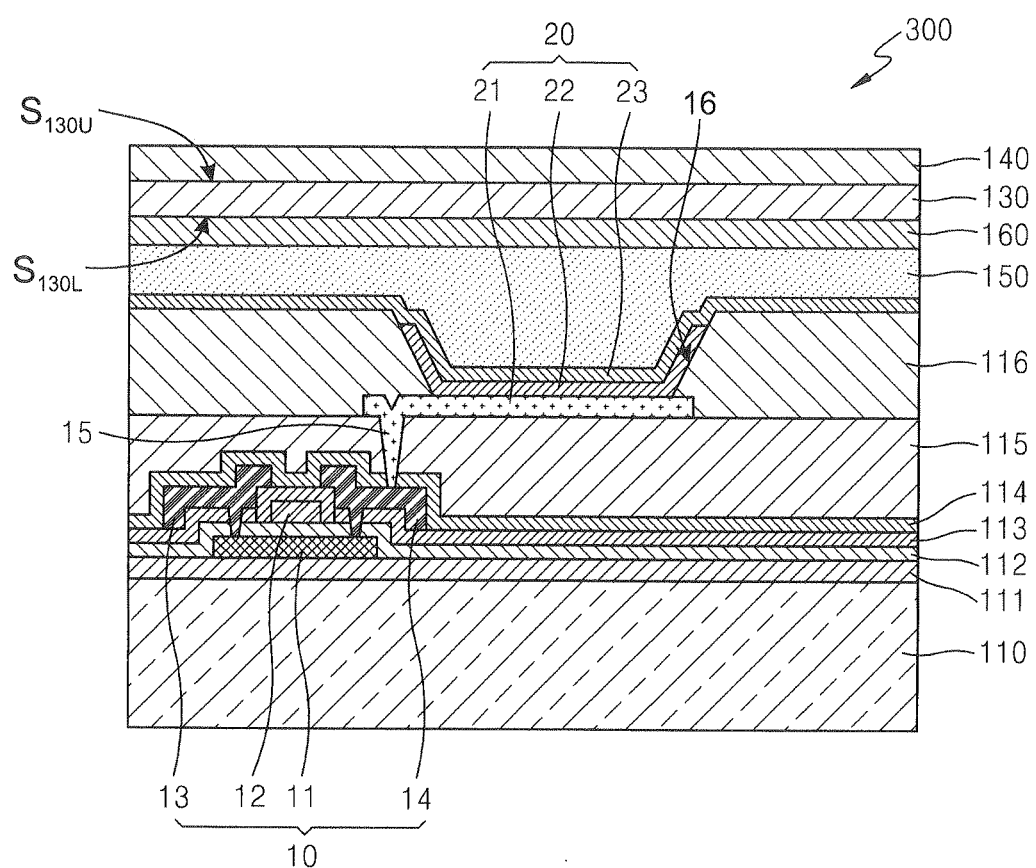
FIG. 3 is a schematic cross-sectional partial view of a an organic light-emitting display (OLED) apparatus constructed with principles of still another embodiment of the present invention.

FIG. 3 is a schematic sectional partial view showing a portion of an organic light-emitting display (OLED) apparatus constructed with still another embodiment of the present invention.

Referring to FIG. 3, an OLED apparatus 300 constructed with the present embodiment may include a substrate 110, an organic light-emitting device 20, a metal sheet 130, a sealant 150, a polymer layer 140, and an absorbent 160. In accordance with the present embodiment, the organic light-emitting device 20 may operate as the display unit 120 of previous embodiments as shown in FIGS. 1 and 2.

The substrate 110 may be a transparent glass substrate which includes $SiO_2$ as a main component, however is not limited thereto.

The organic light-emitting device 20 and a thin film transistor (TFT) 10, which is connected to the organic light-emitting device 20, are disposed above the substrate 10. One organic light-emitting device 20 and one TFT 10 are shown in FIG. 3 for convenience. The OLED apparatus 300 constructed with the present embodiment however, may include a plurality of organic light-emitting devices 20 and a plurality of TFTs 10.

The OLED apparatus 300 may be classified as a passive matrix (PM) type or an active matrix (AM) type in dependence upon whether the organic light-emitting device 20 is driven under control of the TFT 10. The OLED apparatus 300 constructed with the present embodiment may be applied to any one of a PM type and an AM type. Hereinafter, a case where the OLED apparatus 300 is of an AM type will be described as an example.

A buffer layer 111 may be formed of $SiO_2$ and/or SiNx on the substrate 110 in order to smooth the substrate 110 and to prevent impure elements from permeating into the substrate 110.

An active layer 11 of the TFT 10 may be formed of a semiconductor material on the buffer layer 111, and a gate insulating layer 112 may be formed to cover the active layer 11. A gate electrode 12 may be formed on the gate insulating layer 112, and an interlayer insulating layer 113 may be formed to cover the gate electrode 12. A source electrode 13 and a drain electrode 14 may be formed on the interlayer insulating layer 113, and a passivation layer 114 and a planarizing layer 115 may be sequentially formed to cover the source and drain electrodes 13 and 14. In one embodiment, reference number 13 may refer to the drain electrode and reference number 14 may refer to the source electrode.

In one embodiment, the gate insulating layer 112 may be in direct contact with the active layer 11. The gate insulating layer 112 may be in direct contact with the buffer layer 111. The gate electrode 12 may be in direct contact with the gate insulating layer 112, and the interlayer insulating layer 113 may be in direct contact with the gate electrode 12. The source electrode 13 and the drain electrode 14 may be in direct contact with the interlayer insulating layer 113. The passivation layer 114 may be direct contact with the source electrode 13 and the drain electrode 14. The planarizing layer 115 may be in direct contact with the passivation layer 114.

The gate insulating layer 112, the interlayer insulating layer 113, the passivation layer 114, and the planarizing layer 115 may function as electrical insulators and be formed of inorganic materials, organic materials, or compounds of organic/inorganic materials in single structures or multilayer structures. A stack structure of the TFT 10 is an example, and thus TFT having various structures may be applied.

A first electrode 21 may be formed on the planarizing layer 115 and may operate as an anode electrode of the organic light-emitting device 20, and a pixel-defining layer (PDL) 116 may be formed to the first electrode 21. An opening 16 may be formed in the PDL 116, and an organic emission layer (OEML) 22 of the organic light-emitting device 20 may be formed in an area defined by the opening 16. A second electrode 23 may be formed to cover all pixels and operate as a cathode electrode of the organic light-emitting device 20. Polarities of the first and second electrodes 21 and 23 may be reversed. The first electrode 21 may be electrically contact with the drain electrode 14 via a through hole 15.

The OLED apparatus 300 constructed as the present embodiment is a bottom-emission type OLED apparatus which realizes an image by light emitted toward the substrate 110. Therefore, the first electrode 21 may be a transparent electrode, and the second electrode 23 may be a reflective electrode.

The first electrode 21 may be formed of ITO, IZO, ZnO, or $In_2O_3$, and the second electrode 23 may be formed of Li, Ca, LiF/Ca, LiF/Al, Al, Mg, or a compound of Li, Ca, LiF/Ca, LiF/Al, Al, and Mg.

The OEML 22 formed between the first and second electrodes 21 and 23 may be formed of a low molecular weight organic material or a high molecular weight organic material. If the OEML 22 is formed of the low molecular weight organic material, a hole injection layer (HIL: not shown), a hole transport layer (HTL: not shown), an electron transport layer (ETL: not shown), an electron injection layer (EIL: not shown), and the like may be stacked in a single structure or a multilayer structure. The OEML 22 is positioned among the HIL, the HTL, the ETL, the EIL, and the like. Copper phthalocyanine (CuPc), N,N'-di(naphthalene-1-yl)-N, N'-diphenyl-benzidine (NPB), tris-8-hydroxyquinoline aluminum (Alq3), or the like may be used as the low molecular weight organic material. These low molecular weight organic materials may be formed by using masks and a vacuum evaporation method.

If the OEML 22 is formed of the high molecular weight organic material, the OLED apparatus 300 may have a structure in which a HTL (not shown) is further disposed from the OEML 22 toward the anode electrode. The HTL may be formed of poly(3,4-ethylenedioxythiophene) (PEDOT), and the OEML 22 may be formed of a poly-phenylenevinylene (PPV)-based or polyfluorene-based high molecular weight organic material.

The metal sheet 130 may be disposed as a sealing material for sealing the organic light-emitting device 20 above the substrate 110 including the organic light-emitting device 20. Here, the metal sheet 130 is disposed to face the substrate 110.

As described above, the metal sheet 130 may include one or more metal materials selected from Al, SUS, invar, and Mg and may be formed thinly to a thickness of about several micrometers (μm). Thus, the OLED apparatus 300 may be manufactured thinner and material cost may be further reduced compared to the OLED apparatus in which a glass substrate is used as a sealing member.

The sealant 150, which includes one or more materials selected from an epoxy-based adhesive, a silicon-based adhesive, and an acryl-based adhesive, may be disposed between the substrate 110 and the metal sheet 130.

As described above, in comparison with a case where a frit is used as a sealant, in the present embodiment, the organic light-emitting device 20 may be prevented from deterioration induced by laser radiation, and the step of hardening fit may be omitted in order to reduce the manufacturing time.

The sealant 150 may fill the entire free space between the substrate 110 and the metal sheet 130 and the sealant 150 may operate as a filler, thereby increasing a mechanism strength of the OLED apparatus 300.

The polymer layer 140 having a lower thermal expansion coefficient than that of the metal sheet 130 may be formed directly on a surface $S_{130U}$ of the metal sheet 130 which is opposite to a surface $S_{130L}$ of the metal sheet 130 facing toward the organic light-emitting device 20. The polymer layer 140 may operate as a thermal buffer with respect to the metal sheet 130 and may prevent the surface of the metal sheet 130 from wrinkling due to expansion and shrinkage of the metal sheet 130 caused by hardening of the sealant 150.

The absorbent 160 may be formed on the surface $S_{130L}$ of the metal sheet 130 which faces toward the organic light-emitting device 20. The absorbent 160 may include one or more materials selected from CaO, BaO, a zeolite-based organic metal complex, an Al-based organic metal complex, and a polyacrylic acid. The absorbent 160 may be formed directly on the surface $S_{130L}$ of the metal sheet 130 by using a laminating method, a printing method, or the like. Therefore, the absorbent 160 may prevent the organic light-emitting device 20 from deterioration due to external moisture.

According to the present embodiment, the thin OLED display apparatus 300 may be manufactured to be thinner at lower material costs by using a simpler process and may be prevented from being deteriorated due to moisture permeance.

As described above, in a flat panel display apparatus and an OLED apparatus according to the present invention, a metal sheet may be formed thinly to a thickness of about several micrometers (μm). Thus, the flat panel display apparatus and the OLED apparatus may be manufactured thinner than the OLED apparatus in which a glass substrate is used as a sealing member.

Since the metal sheet is cheaper than the glass substrate, material cost may be reduced.

A polymer layer may be formed on an outer surface of the metal sheet, may operate as a thermal buffer with respect to the metal sheet, and may prevent the surface of the metal sheet from wrinkling by expansion and shrink of the metal sheet.

Since elements illustrated in the drawings may be enlarged or reduced for convenience, the present invention is not restricted to sizes or shapes of the elements. It will be understood by those of ordinary skill in the art that various changes in form and details may be made therein without departing from the spirit and scope of the present invention as defined by the following claims.

What is claimed is:

1. A flat panel display apparatus, comprising:
a substrate;
a display unit disposed on the substrate and the display unit displaying an image;
a metal sheet disposed spaced apart from the substrate;
a sealant filling an entire space disposed between the substrate and the metal sheet, the sealant in direct physical contact with the metal sheet; and
a polymer layer disposed directly on the metal sheet and having a lower thermal expansion coefficient compared to that of the metal sheet.

2. The flat panel display apparatus of claim 1, wherein the polymer layer is disposed on a first surface of the metal sheet and the first surface of the metal sheet is disposed opposite to a second surface of the metal sheet facing towards the display unit.

3. The flat panel display apparatus of claim 1, wherein the polymer layer is laminated directly on the first surface of the metal sheet.

4. The flat panel display apparatus of claim 1, the polymer layer being in physical contact with the entire first surface of the metal sheet.

5. The flat panel display apparatus of claim 1, further comprising an absorbent formed between the substrate and the metal sheet.

6. The flat panel display apparatus of claim 5, wherein the absorbent is disposed on a second surface of the metal sheet which faces towards the display unit.

7. The flat panel display apparatus of claim 5, wherein the absorbent is coated directly on a second surface of the metal sheet and the second surface of the metal sheet faces towards the display unit.

8. The flat panel display apparatus of claim 5, wherein the absorbent comprises one or more materials selected from calcium oxide (CaO), barium oxide (BaO), a zeolite-based organic metal complex, an aluminum (Al)-based organic metal complex, and a polyacrylic acid.

9. The flat panel display apparatus of claim 1, wherein the metal sheet comprises one or more materials selected from Al, stainless steel (SUS), invar, and a magnesium (Mg).

10. The flat panel display apparatus of claim 1, wherein the polymer layer comprises one of polyethylene terephthalate (PET) and polyethylene nylon (PEN).

11. The flat panel display apparatus of claim 1, wherein the sealant comprises one or more materials selected from an epoxy-based adhesive, a silicon-based adhesive, and an acryl-based adhesive.

12. The flat panel display apparatus of claim 1, wherein the display unit is an organic light-emitting device which comprises an organic emission layer (OEML) which intervenes between first and second electrodes.

13. An organic light-emitting display (OLED) apparatus, comprising:
a substrate;
an organic light-emitting device which is disposed on the substrate and comprises an organic emission layer (OEML) which intervenes between first and second electrodes;
a metal sheet disposed opposite to the substrate;
a sealant filling an entire space disposed between the substrate and the metal sheet and sealing the entire space, the sealant in direct physical contact with the metal sheet;
a polymer layer disposed in direct physical contact with a first surface of the metal sheet with the first surface of the metal sheet being opposite to a second surface of the metal sheet facing towards the organic light-emitting device, and the polymer layer having a lower thermal expansion coefficient compared to that of the metal sheet; and an absorbent disposed between the substrate and the metal sheet.

14. The OLED apparatus of claim 13, the polymer layer being in physical contact with the entire first surface of the metal sheet.

15. The OLED apparatus of claim 13, wherein the polymer layer comprises one of polyethylene terephthalate (PET) and polyethylene nylon (PEN).

16. The OLED apparatus of claim 13, wherein the sealant comprises one or more materials selected from an epoxy-based adhesive, a silicon-based adhesive, and an acryl-based adhesive.

17. The OLED apparatus of claim 13, wherein the absorbent is coated directly on the second surface of the metal sheet which faces towards the organic light-emitting device.

18. The OLED apparatus of claim 13, further comprising a buffer layer which is formed on the substrate.

19. The OLED apparatus of claim 13, wherein an image is realized by light transmitted toward the substrate.

20. A display apparatus, comprising:

a substrate having a display unit formed on the substrate to display variable visual images;

a metal sheet providing a first major surface disposed spaced apart from and opposite to the substrate;

a polymer layer having a lower thermal expansion coefficient compared to that of the metal sheet, disposed directly on and covering a second major surface of the metal sheet; and a sealant filling an entire free space disposed between the substrate and the metal sheet, the sealant in direct physical contact with the metal sheet.

* * * * *